(12) United States Patent
Lin

(10) Patent No.: US 12,011,803 B2
(45) Date of Patent: Jun. 18, 2024

(54) CARRIER HEAD HAVING ABRASIVE STRUCTURE ON RETAINER RING

(71) Applicant: Taiwan Semiconductor Manufacturing Co., Ltd., Hsin-Chu (TW)

(72) Inventor: Chang-Sheng Lin, Baoshan Township (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 891 days.

(21) Appl. No.: 16/419,256

(22) Filed: May 22, 2019

(65) Prior Publication Data

US 2019/0270180 A1 Sep. 5, 2019

Related U.S. Application Data

(60) Continuation of application No. 15/436,953, filed on Feb. 20, 2017, now Pat. No. 10,300,578, which is a
(Continued)

(51) Int. Cl.
*B24B 53/017* (2012.01)
*B24B 37/04* (2012.01)
(Continued)

(52) U.S. Cl.
CPC .......... *B24B 53/017* (2013.01); *B24B 37/10* (2013.01); *B24B 37/30* (2013.01); *B24B 37/32* (2013.01);
(Continued)

(58) Field of Classification Search
CPC ....... B24B 53/017; B24B 53/02; B24B 37/10; B24B 37/30; B24B 37/32; B24B 37/005;
(Continued)

(56) References Cited

U.S. PATENT DOCUMENTS 3,508,890 A * 4/1970 Fontanella ........... B24D 11/005
428/650
5,205,082 A * 4/1993 Shendon ................. B24B 37/30
451/283
(Continued)

OTHER PUBLICATIONS

Notice of Allowance dated Nov. 17, 2016 in connection with U.S. Appl. No. 14/105,232.
(Continued)

*Primary Examiner* — Laura C Guidotti
*Assistant Examiner* — Caleb Andrew Holizna
(74) *Attorney, Agent, or Firm* — Eschweiler & Potashnik, LLC

(57) ABSTRACT

The present disclosure, in some embodiments, relates to a polishing system. The polishing system includes a carrier head configured to enclose a wafer. The carrier head has a retainer ring configured to laterally surround the wafer and an abrasive structure that partially covers a lower surface of the retainer ring. A membrane support is surrounded by the retainer ring and defines one or more ports. One or more chambers are coupled to the one or more ports and are defined by the membrane support and a flexible membrane having a lower surface configured to contact the wafer.

20 Claims, 6 Drawing Sheets

Related U.S. Application Data division of application No. 14/105,232, filed on Dec. 13, 2013, now Pat. No. 9,604,340.

(51) Int. Cl.
| | |
|---|---|
| *B24B 37/10* | (2012.01) |
| *B24B 37/30* | (2012.01) |
| *B24B 37/32* | (2012.01) |
| *B24B 53/02* | (2012.01) |
| *H01L 21/306* | (2006.01) |
| *H01L 21/67* | (2006.01) |
| *B24B 37/005* | (2012.01) |

(52) U.S. Cl.
CPC ........ *B24B 53/02* (2013.01); *H01L 21/30625* (2013.01); *H01L 21/67253* (2013.01); *B24B 37/005* (2013.01); *B24B 37/042* (2013.01)

(58) Field of Classification Search
CPC ....... B24B 37/042; B24B 37/20; B24B 37/37; B24B 53/12; H01L 21/30625; H01L 21/67253
USPC .......................................................... 451/41
See application file for complete search history.

(56) References Cited

U.S. PATENT DOCUMENTS

| | | | |
|---|---|---|---|
| 5,749,771 A | 5/1998 | Isobe | |
| 6,004,193 A | 12/1999 | Nagahara et al. | |
| 6,019,670 A | 2/2000 | Cheng et al. | |
| 6,139,428 A | 10/2000 | Drill et al. | |
| 6,168,684 B1 * | 1/2001 | Mitsuhashi | B24B 47/10 |
| | | | 451/287 |
| 6,224,472 B1 | 5/2001 | Lai et al. | |
| 6,245,193 B1 | 6/2001 | Quek et al. | |
| 6,277,008 B1 | 8/2001 | Masuta et al. | |
| 6,290,584 B1 | 9/2001 | Kim et al. | |
| 6,302,770 B1 | 10/2001 | Aiyer | |
| 6,398,906 B1 * | 6/2002 | Kobayashi | B24B 41/061 |
| | | | 156/345.12 |
| 6,447,368 B1 | 9/2002 | Fruitman et al. | |
| 6,565,705 B2 | 5/2003 | Hung et al. | |
| 6,607,428 B2 | 8/2003 | Tolles | |
| 6,623,343 B2 * | 9/2003 | Kajiwara | B24B 37/30 |
| | | | 451/36 |
| 6,699,107 B2 | 3/2004 | Stoeckgen et al. | |
| 6,733,370 B2 | 5/2004 | Aiyer | |
| RE39,195 E | 7/2006 | Doan et al. | |
| 7,654,888 B2 | 2/2010 | Zuniga et al. | |
| 8,696,405 B2 | 4/2014 | Duescher | |
| 9,597,771 B2 | 3/2017 | Lin et al. | |
| 2004/0192173 A1 * | 9/2004 | Zuniga | B24B 37/30 |
| | | | 451/287 |
| 2005/0215182 A1 | 9/2005 | Fuhriman et al. | |
| 2007/0049184 A1 * | 3/2007 | Venigalla | B24B 37/32 |
| | | | 451/285 |
| 2008/0261497 A1 * | 10/2008 | Ichinoshime | B24B 37/32 |
| | | | 451/285 |
| 2012/0058709 A1 * | 3/2012 | Fukushima | B24B 37/10 |
| | | | 451/364 |
| 2012/0289125 A1 * | 11/2012 | Billig | B24B 19/00 |
| | | | 451/36 |
| 2013/0225052 A1 * | 8/2013 | Song | B24B 53/017 |
| | | | 427/556 |
| 2014/0154956 A1 * | 6/2014 | Lee | B24B 37/32 |
| | | | 451/443 |
| 2015/0209930 A1 | 7/2015 | Chen et al. | |

OTHER PUBLICATIONS

Non-Final Office Action dated Jul. 28, 2016 in connection with U.S. Appl. No. 14/105,232.

Final Office Action dated Apr. 21, 2016 in connection with U.S. Appl. No. 14/105,232.

Non-Final Office Action dated Oct. 6, 2015 in connection with U.S. Appl. No. 14/105,232.

Non-Final Office Action dated Oct. 19, 2018 for U.S. Appl. No. 15/436,953.

Notice of Allowance dated Mar. 28, 2019 for U.S. Appl. No. 15/436,953.

* cited by examiner

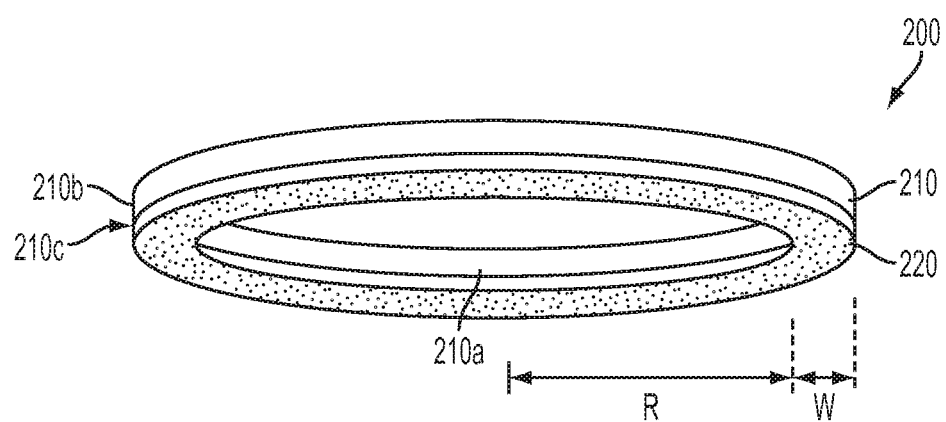
FIG. 2
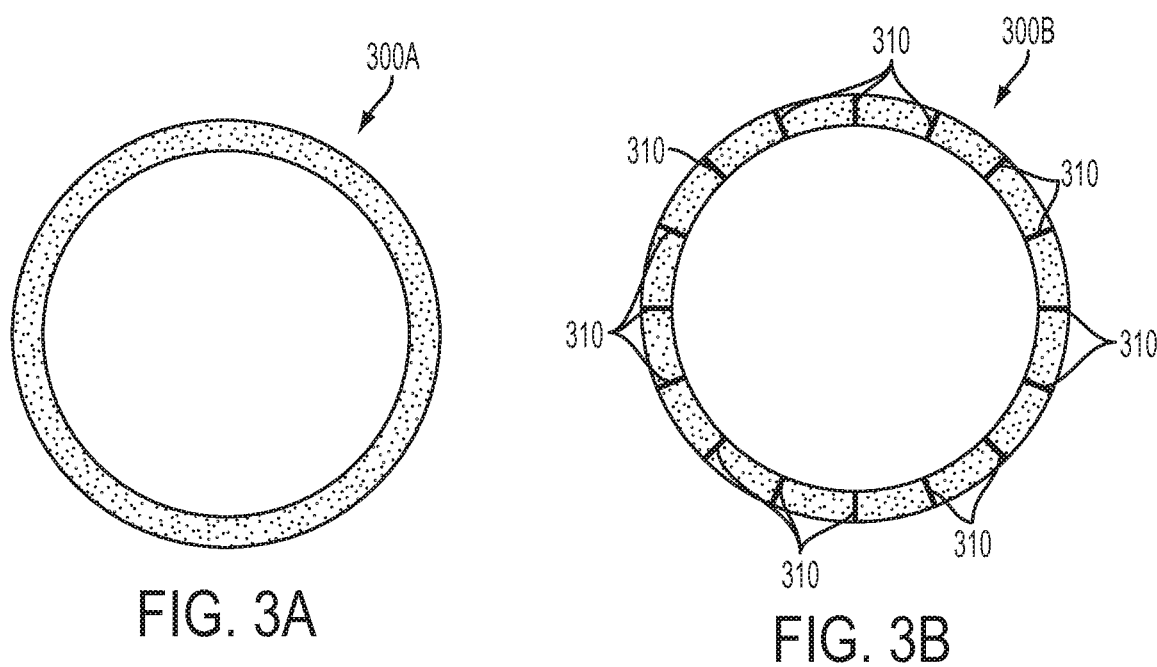
FIG. 3A
FIG. 3B

CARRIER HEAD HAVING ABRASIVE STRUCTURE ON RETAINER RING

REFERENCE TO RELATED APPLICATIONS

This application is a Continuation of U.S. application Ser. No. 15/436,953, filed on Feb. 20, 2017, which is a Divisional of U.S. application Ser. No. 14/105,232, filed on Dec. 13, 2013 (now U.S. Pat. No. 9,604,340, issued on Mar. 28, 2017). The contents of the above-referenced patent applications are hereby incorporated by reference in their entirety.

BACKGROUND

The semiconductor integrated circuit (IC) industry has experienced rapid growth. Technological advances in IC materials and design have produced generations of ICs where each generation has smaller and more complex circuits than the previous generation. However, these advances have increased the complexity of processing and manufacturing ICs and, for these advances to be realized, developments in IC processing and manufacturing occur. For example, planarization technology, such as a chemical mechanical polishing (CMP) process, has been implemented to planarize a wafer or one or more layers of features over the wafer in order to reduce a thickness of the wafer, remove excessive materials from the processed surface, or prepare the processed surface for a subsequent manufacturing process.

DESCRIPTION OF THE DRAWINGS

One or more embodiments are illustrated by way of example, and not by limitation, in the figures of the accompanying drawings, wherein elements having the same reference numeral designations represent like elements throughout.

FIG. 2 is a perspective view of a retainer ring in accordance with one or more embodiments.

FIG. 3A is a bottom view of a retainer ring in accordance with one or more embodiments.

FIG. 3B is a bottom view of another retainer ring in accordance with one or more embodiments.

DETAILED DESCRIPTION

Figure 1:
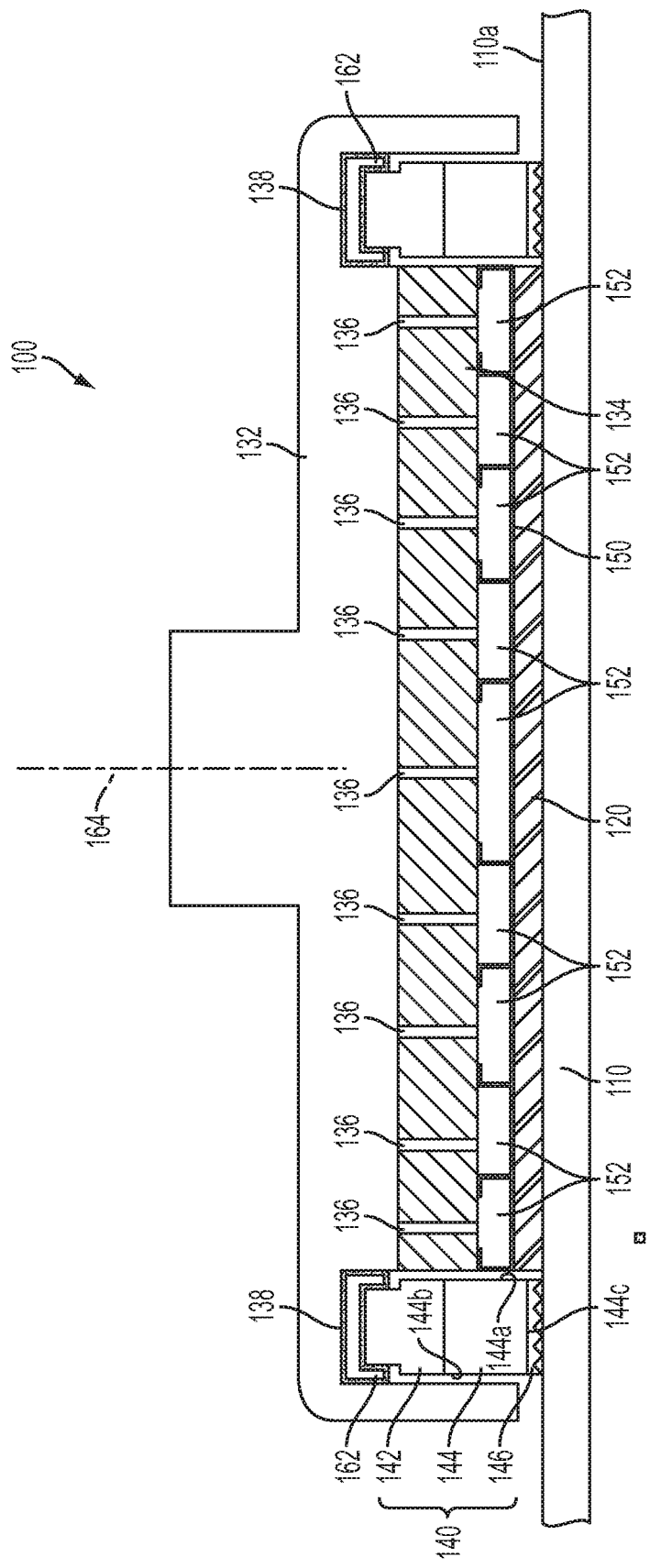
FIG. 1 is a cross-sectional view of a carrier head over a polishing pad in accordance with one or more embodiments.

It is understood that the following disclosure provides one or more different embodiments, or examples, for implementing different features of the disclosure. Specific examples of components and arrangements are described below to simplify the present disclosure. These are, of course, examples and are not intended to be limiting. In accordance with the standard practice in the industry, various features in the drawings are not drawn to scale and are used for illustration purposes only.

FIG. 1 is a cross-sectional view of a carrier head 100 over a polishing pad 110 in accordance with one or more embodiments. Carrier head 100 is usable in a polishing system, such as a polishing system 600 depicted in FIG. 6 vide infra. A wafer 120 is enclosed in carrier head 100 and positioned between carrier head 100 and polishing pad 110. Polishing pad 110 and wafer 120 are not part of carrier head 100 for illustration purposes.

Polishing pad 110 is used to remove materials from wafer 120. In some embodiments, during a polishing process, retainer ring 140 and wafer 120 are in contact with polishing pad 110. In some embodiments, a slurry compound is present on polishing pad 110 during the polishing process. In some embodiments, polishing pad 110 is movable relative to wafer 120.

Wafer 120 is configured to be confined under carrier head 100 and between carrier head 100 and polishing pad 110. In some embodiments, wafer 120 contains active devices. In some embodiments, wafer 120 contains passive devices. In some embodiments, wafer 120 is a raw un-processed wafer. In some embodiments, carrier head 100 is configured to move wafer 120 relative to polishing pad 130.

Carrier head 100 includes a housing 132, and the housing is configured to enclose a membrane support 134. Membrane support 134 has one or more ports 136 defined therein. A retainer ring recess 138 is in housing 132 around membrane support 134. A retainer ring 140 is in retainer ring recess 138. A flexible membrane 150 is secured to membrane support 134 and is configured to press wafer 120 against polishing pad 110.

Housing 132 is configured to hold wafer 120 against polishing pad 110. Housing 132 is capable of moving in a direction perpendicular to a polishing surface (e.g., the upper surface 110a) of polishing pad 110 during the polishing process. A separation distance between housing 122 and polishing pad 110 is maintained during the polishing process to avoid distortion or damage to polishing pad 110. Housing 132 includes a material having sufficient mechanical strength to withstand the pressure exerted during the polishing process. Housing 132 has a diameter sufficiently large to enclose wafer 120 and retainer ring 140 surrounding the wafer. Housing 132 includes retainer ring recess 138 in a periphery region to accommodate retainer ring 140. In some embodiments, housing 132 is rotatable in a plane parallel to polishing pad 110. In some embodiments, housing 132 is pivotable about an axis 164 perpendicular to the polishing surface of polishing pad 140.

Flexible membrane 150 has a lower surface configured to be in contact with wafer 120. In some embodiments, flexible membrane 150 and membrane support 134 form one or more chambers 152. Membrane 150 is used to increase uniformity of the pressure applied to wafer 120 during the polishing process. Pressures of chambers 152 are set by fluid or air provided through corresponding ports 136 in order to shape or maintain a predetermined surface profile at the lower surface of the flexible membrane 150. As a result, pressure applied to wafer 120 is controlled to be evenly distributed throughout the entire wafer. In some embodiments, membrane 150 is formed of a flexible and elastic fluid-impermeable material. In some embodiments, membrane 150 includes at least one of neoprene, chloroprene, ethylene propylene rubber, silicone, or other suitable flexible materials.

In some embodiments, membrane support 134 is solid. In some embodiments, membrane support 134 is a substantially rigid material, such as a metal, a dielectric material, or another suitable material. In some embodiments, membrane support 134 is omitted, and housing 122 directly provides support for membrane 150.

Carrier head 100 further includes one or more cushion members 162 in the retainer ring recess 138. The one or more cushion members 162 are configured to press the retainer ring 140 against the polishing pad 110 and to adjust position of retainer ring 130 by adjusting corresponding pressures of the cushion members 162. In some embodiments, cushion members 162 each include a flexible element enclosing a chamber for containing a fluid. In some embodiments, cushion members 162 include a flexible solid material. In some embodiments, cushion members 162 are omitted, and retainer ring 140 is directly attached to retainer ring recess 138.

Retainer ring 140 is used to reduce lateral movement of wafer 120 with respect to carrier head during the polishing process. In order to reduce lateral movement of wafer 120, carrier head 100 presses retainer ring 140 against polishing pad 130. Retainer ring 140 includes an upper portion 142, a body 144, and an abrasive structure 146. Retainer ring 140 is attached to retainer ring recess 138 through upper portion 142 of retainer ring 140. Body 144 includes an inner periphery 144a configured to surround the wafer 120, an outer periphery 144b, and a lower surface 144c connecting inner periphery 144a and outer periphery 144b. Abrasive structure 146 is attached to lower surface 144c of body 144. Abrasive structure 146 is configured to maintain a roughness of an upper surface 110a of polishing pad 110 within a predetermined range, when polishing pad 110 and carrier head 100 are operated to polish the wafer 120 at a predetermined removal rate.

In some embodiments, the roughness of the upper surface 110a of polishing pad 110 is measurable according to physical dimension of apexes and valleys of upper surface 110a of polishing pad 110. In some embodiments, the roughness of the upper surface 110a of polishing pad 110 is measurable indirectly according to a removal rate under a predetermined polishing process.

FIG. 2 is a perspective view of a retainer ring 200 in accordance with one or more embodiments. In some embodiments, retainer ring 200 is usable as retainer ring 140 in FIG. 1. Retainer ring 200 includes a body 210, which corresponds to body 144, and an abrasive structure 220, which corresponds to abrasive structure 146. In FIG. 2, a structure of retainer ring 200 corresponding to upper portion 142 is omitted or not depicted in order to facilitate an explanation.

Body 210 includes an inner periphery 210a, an outer periphery 210b, and a lower surface 210c connecting inner periphery 210a and outer periphery 210b. Inner periphery 210a has a radius R and is configured to surround a wafer. In some embodiments, radius R determines the largest size of wafer suitable to be used in conjunction with retainer ring 200. In some embodiments, radius R is at least 0.05 millimeters (mm) greater than a radius of the wafer to be surrounded by retainer ring 200. In some embodiments, radius R is at most 1 mm greater than the radius of the wafer to be surrounded by retainer ring 200. Surface 210c has a width W measurable along a radial direction. In some embodiments, width W ranges from 0.5 inches (in) to 2 in.

Abrasive structure 220 is attached to surface 210c of body 210. In the embodiment depicted in FIG. 2, abrasive structure 220 covers the entire surface 210c of body 210. In some embodiments, abrasive structure 220 only partially covers surface 210c of body 210. In some embodiments, an overall abrasive surface area of the abrasive structure 220, which is determined according to width W of surface 210c and a coverage percentage of surface 210c covered by abrasive structure 220, is configured to be sufficient to compensate a degradation rate of the roughness of polishing pad 110 during a predetermined polishing process.

In some embodiments, a larger overall abrasive surface area of the abrasive structure 220 over-compensates the degradation rate of the roughness of polishing pad 110. Thus, polishing pad 110 eventually becomes too rough to maintain a predetermined smoothness of the processed surface of wafer 120. In some embodiments, a lesser overall abrasive surface area of the abrasive structure 220 under-compensates the degradation rate of the roughness of polishing pad 110. Thus, polishing pad 110 eventually becomes too smooth to be usable to polish wafer 120 at a predetermined removal rate.

FIG. 3A is a bottom view of a retainer ring 300A in accordance with one or more embodiments. In some embodiments, lower surface (such as surface 210c) of the body of retainer ring 300A has a ring shape and is substantially planar without discontinuity. FIG. 3B is a bottom view of another retainer ring 300B in accordance with one or more embodiments. In some embodiments, lower surface (such as surface 210c) of the body of retainer ring 300B has grooves 310 defined thereon. In some embodiments, retainer ring 300B has about 2 to 100 grooves. In some embodiments, one or more of grooves 310 have a groove width ranging from 30 mm to 100 mm. In some embodiments, a total groove area (viewed from the bottom as depicted in FIG. 3B) is less than 33% of a total ring shape area of the surface (viewed from the bottom as depicted in FIG. 3B).

Figure 4A:
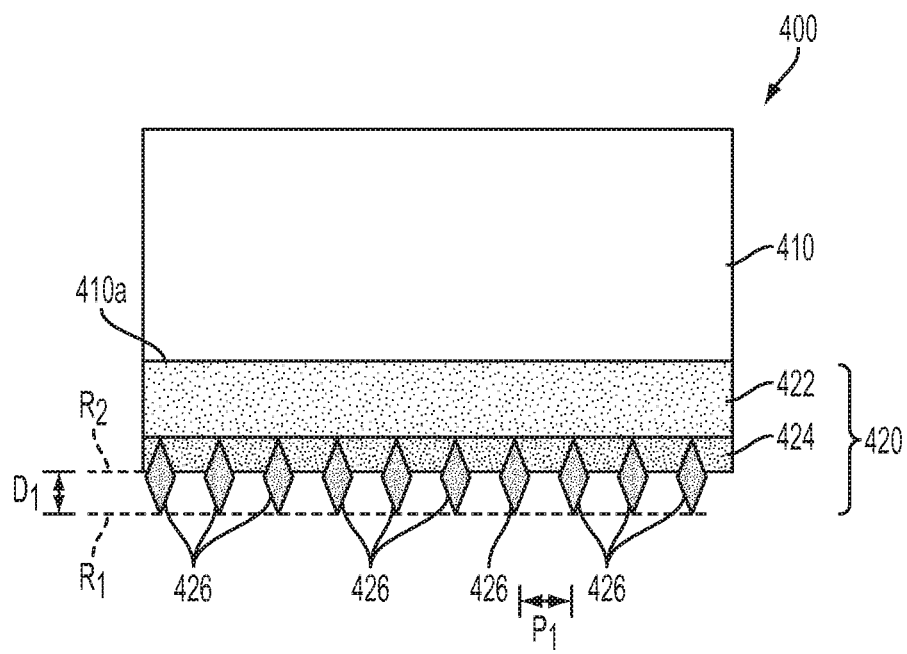
FIG. 4A is a cross-sectional view of a retainer ring in accordance with one or more embodiments.

FIG. 4A is a cross-sectional view of a retainer ring 400 in accordance with one or more embodiments. In some embodiments, retainer ring 400 is usable as retainer ring 140 in FIG. 1. Retainer ring 400 includes a body 410, which corresponds to body 144, and an abrasive structure 420, which corresponds to abrasive structure 146. In FIG. 4A, a structure of retainer ring 400 corresponding to upper portion 142 is omitted or not depicted in order to facilitate the explanation of the present application.

Abrasive structure 420 includes an adhesive layer 422, a reinforcement layer 424, and abrasive particles 426 partially buried in reinforcement layer 424. Adhesive layer 422 is between reinforcement layer 424 and a surface 410a of body 410. In some embodiments, adhesive layer 422 includes a pressure sensitive adhesive material. In some embodiments, adhesive layer 422 is omitted, and reinforcement layer 424 is directly attached to surface 410a of body 410.

Reinforcement layer 424 is configured to bind abrasive particles 426 with adhesive layer 422 or body 410. In some embodiments, reinforcement layer 424 has a material comprising chrome, nickel, iron, manganese, cobalt, or aluminum oxide. In some embodiments, the abrasive particles 426 include diamonds.

As depicted in FIG. 4A, abrasive structure 420 has a texture comprising apexes defining a reference plane R1 and valleys defining another reference plane R2. In some embodiments, the apexes are arranged to have a pitch P1 ranging from 60 microns ($\mu$m) to 1000 $\mu$m. In some embodiments, the apexes and the valleys has a distance D1 ranging from 15 $\mu$m to 300 $\mu$m.

Figure 4B:
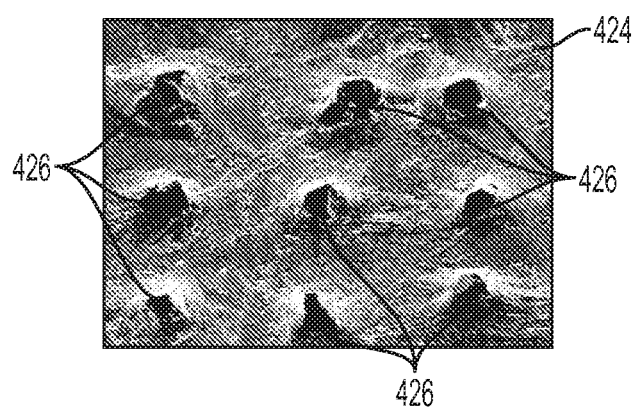
FIG. 4B is a photograph of a portion of an abrasive structure of the retainer ring in accordance with one or more embodiments.

FIG. 4B is a photograph of a portion of an abrasive structure 420 of the retainer ring, e.g., that in FIG. 4A, in accordance with one or more embodiments. Abrasive particles 426 are arranged as an array and partially buried in reinforcement layer 424. Abrasive structure 420 forms a texture comprising apexes and valleys as illustrated above.

Figure 5A:
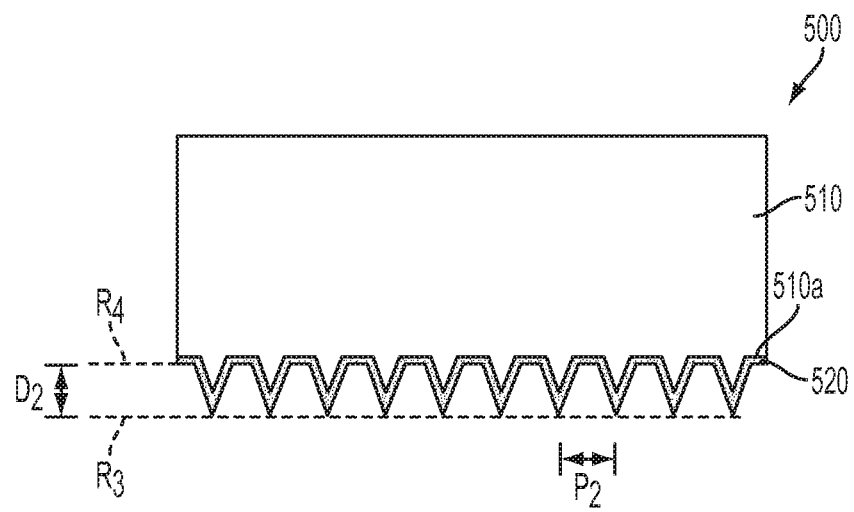
FIG. 5A is a cross-sectional view of another retainer ring in accordance with one or more embodiments.

FIG. 5A is a cross-sectional view of another retainer ring 500 in accordance with one or more embodiments. In some embodiments, retainer ring 500 is usable as retainer ring 140 in FIG. 1. Retainer ring 500 includes a body 510, which corresponds to body 144, and an abrasive structure 520, which corresponds to abrasive structure 146. In FIG. 5A, a structure of retainer ring 500 corresponding to upper portion 142 is omitted or not depicted in order to facilitate the explanation of the present application.

A lower surface 510a (corresponding to surface 144c) of body 510 is configured to have a texture. In some embodiments, the texture includes pyramids or cones. Abrasive structure 520 includes a film conformally formed on the surface 510a. In some embodiments, the film includes a diamond film; a metal oxide film comprising zirconium, chrome, titanium, aluminum, tantalum, cobalt, ruthenium, or tungsten; or a metal nitride film comprising zirconium, chrome, titanium, aluminum, tantalum, cobalt, ruthenium, or tungsten.

As depicted in FIG. 5A, abrasive structure 520 also forms a texture comprising apexes defining a reference plane R3 and valleys defining another reference plane R4. In some embodiments, the apexes are arranged to have a pitch P2 ranging from 60 μm to 1000 μm. In some embodiments, the apexes and the valleys has a distance D2 ranging from 15 μm to 300 μm.

Figure 5B:
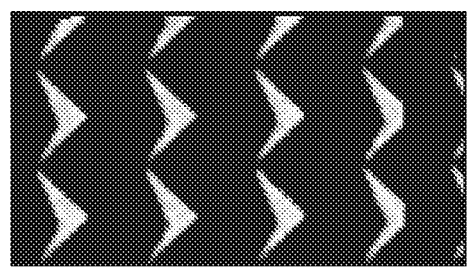
FIG. 5B is a photograph of a portion of an abrasive structure of the retainer ring in accordance with one or more embodiments.

FIG. 5B is a photograph of a portion of an abrasive structure 520 of the retainer ring, e.g., that in FIG. 5A, in accordance with one or more embodiments. Abrasive structure 520 forms a texture comprising apexes and valleys as illustrated above.

Figure 6:
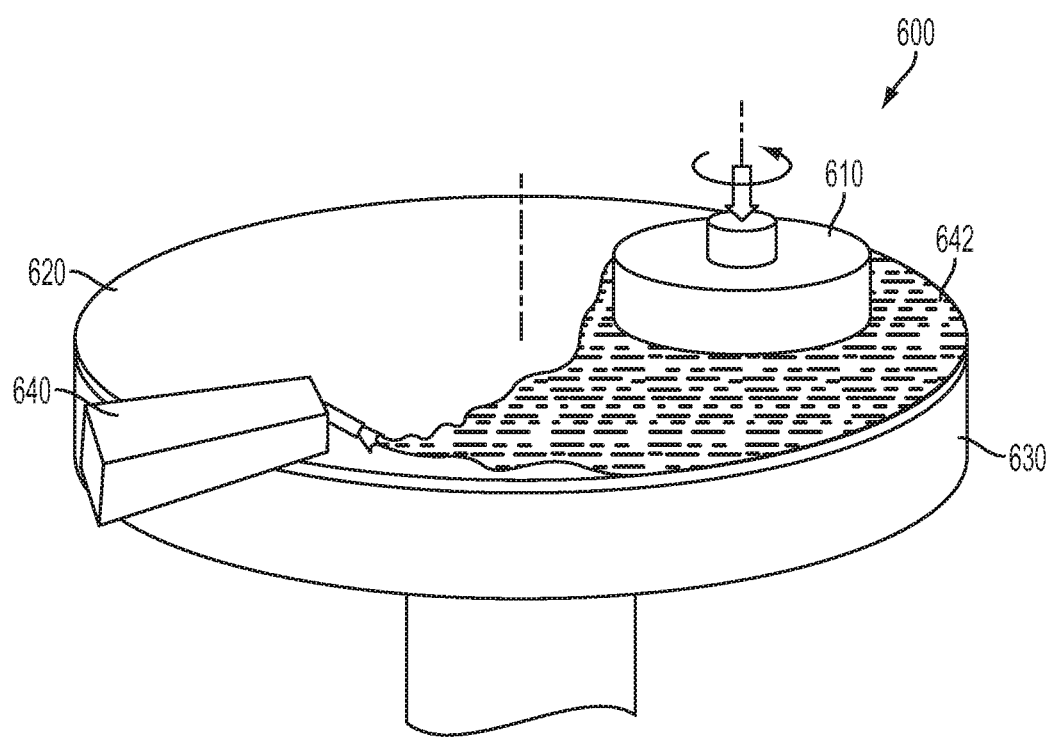
FIG. 6 is a perspective view of a polishing system in accordance with one or more embodiments.

FIG. 6 is a perspective view of a polishing system 600 in accordance with one or more embodiments. In some embodiments, the polishing system 600 is usable for chemical mechanical polishing (CMP).

Polishing system 600 includes a carrier head 610, which is configured to support a wafer to be polished. Carrier head 610 is configured to press the wafer against a polishing pad 620 which is supported by a platen 630. In some embodiments, carrier head 100 in FIG. 1 is usable as carrier head 610 in FIG. 6. A slurry dispenser 640 is disposed over a top surface of polishing pad 620. Slurry 642 is supplied onto the polishing pad 620 through slurry dispenser 640. Retainer ring as illustrated in conjunction with FIGS. 4A-5B is disposed in the carrier head 610 and usable to maintain roughness of the top surface of polishing pad 620, which is also known as re-conditioning polishing pad 620. Therefore, in some embodiments, polishing system 600 is free from having a pad reconditioning arm or a pad reconditioning head, or free from using the pad reconditioning arm or pad reconditioning head during a polishing process.

Carrier head 610 is capable of moving in a direction perpendicular to a top surface of polishing pad 620. Moving carrier head 610 perpendicular to polishing pad 620 facilitates adjusting the pressure applied to the wafer and the retainer ring during the polishing process. A pressure applied to the wafer is a factor in determining a rate of material removal from the wafer. A pressure applied to the retainer ring is a factor in determining sufficient pressure to compensate a degradation rate of the roughness of the polishing pad 620.

In some embodiments, carrier head 610 is configured to rotate with respect to polishing pad 630. In some embodiments, carrier head 610 is configured to translate with respect to polishing pad 630. In some embodiments, a rate of movement of carrier head 610 is constant during the polishing process. In some embodiments, the rate of movement of carrier head 610 is variable during the polishing process. In some embodiments, carrier head 610 is configured to remain stationary during the polishing process. In some embodiments, a rotational speed of the carrier head is set according to a predetermined removal rate of a predetermined polishing process.

Polishing pad 620 is positioned to contact the retainer ring and the wafer during the polishing process. A polishing surface of polishing pad 620 is configured to remove material from the wafer during the polishing process. In some embodiments, polishing pad 630 is polishing pad 110 (FIG. 1).

Platen 630 supports polishing pad 620. In some embodiments, platen 630 is configured to rotate, causing polishing pad 620 to rotate with respect to carrier head 610. In some embodiments, a direction of rotation of platen 630 is opposite to a direction of rotation of carrier head 610. In some embodiments, platen 630 has a rate of rotation equal to a rate of rotation of carrier head 610. In some embodiments, platen 630 has a different rate of rotation from the rate of rotation of carrier head 610. In some embodiments, a rotational speed of platen 630 and polishing pad 620 is set according to a predetermined removal rate of a predetermined polishing process.

Slurry dispenser 640 is configured to deliver a slurry compound (such as slurry 642) to polishing pad 620 during the polishing operation. The slurry 642 helps to remove material from the wafer. A composition of the slurry 642 is selected based on the material being removed from the wafer. In some embodiments, a flow rate of the slurry 642 from slurry dispenser 640 is constant during the polishing process. In some embodiments, the flow rate of the slurry 642 from slurry dispenser 640 is variable.

Figure 7:
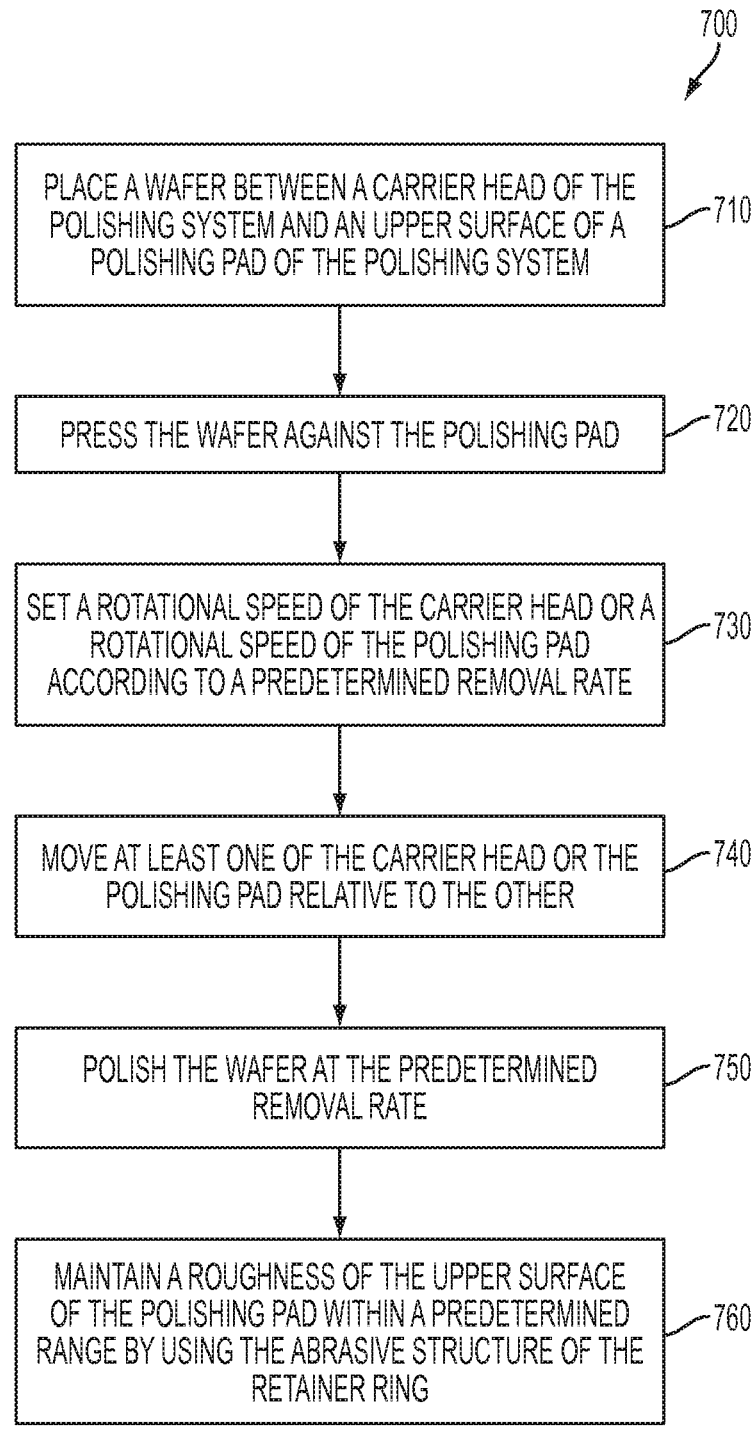
FIG. 7 is a flow chart of a method of using a polishing system in accordance with one or more embodiments.

FIG. 7 is a flow chart of a method 700 of using a polishing system, such as polishing system 600 (FIG. 6) using carrier head 100 (FIG. 1) as carrier head 610, in accordance with one or more embodiments. It is understood that additional operations may be performed before, during, and/or after the method 700 depicted in FIG. 7, and that some other processes may only be briefly described herein.

In operation 710, a wafer 120 is placed between a carrier head 610 of the polishing system 600 and an upper surface of a polishing pad 620 of the polishing system 600. The carrier head 600, such as carrier head 100 depicted in FIG. 1, includes a retainer ring 140 configured to surround the wafer 120. The retainer ring 140 has an abrasive structure 146 configured to contact the upper surface of the polishing pad 110. In operation 720, the wafer 120 and retainer ring 140 are pressed against the polishing pad 110.

In operation 730, a rotational speed of the carrier head 610 or a rotational speed of the polishing pad 620 is set according to a predetermined removal rate. In operation 740, the at least one of the carrier head 610 or the polishing pad 620 is moved relative to the other according to the settings determined in operation 730.

In some embodiments, the polishing pad 620 rotates with respect to the carrier head 610. In some embodiments, a direction of rotation of the polishing pad 620 is opposite to a direction of rotation of the carrier head 610. In some embodiments, the polishing pad 620 has a rate of rotation equal to a rate of rotation of the carrier head 610. In some embodiments, the polishing pad 620 has a different rate of rotation from the rate of rotation of the carrier head 610.

In operation 750, polishing system 600 polishes wafer 120 at the predetermined removal rate. In operation 760, a roughness of the upper surface of the polishing pad 620 is maintained within a predetermined range by using abrasive structure 146 of retainer ring 140.

In some embodiments, the method 700 includes configuring abrasive structure 146 of the retainer ring 140. The configuration of abrasive structure 146 includes determining a degradation rate of the roughness of the polishing pad 620 when the polishing system 600 is configured to polish the wafer at the predetermined removal rate. Then, abrasive structure 146 of carrier head 100/610 is configured to compensate the degradation rate of the roughness of the polishing pad 620 when the polishing system 600 is configured to polish the wafer at the predetermined removal rate.

One of ordinary skill in the art would recognize that additional operations are able to be included in method 700. In some embodiments, the additional operations include supplying slurry to the polishing pad, monitoring and adjusting a pressure applied to the wafer during method 700, or other suitable operations.

In accordance with one embodiment, the present disclosure relates to a method of performing a planarization process. The method comprises placing a wafer between a carrier head and an upper surface of a polishing pad, the carrier head comprising a retainer ring configured to surround the wafer, and the retainer ring comprising an abrasive structure configured to contact the upper surface of the polishing pad. The method further comprises independently regulating pressures within one or more chambers surrounded by the carrier head. The one or more chambers have one or more interior surfaces comprising a flexible membrane, which has a lower surface configured to contact the wafer. The method further comprises moving at least one of the carrier head or the polishing pad relative to the other, and maintaining a roughness of the upper surface of the polishing pad within a predetermined range by using the abrasive structure of the retainer ring.

In accordance with another embodiment, the present disclosure relates to a method of performing a planarization process. The method comprises placing a wafer between a carrier head and an upper surface of a polishing pad, the carrier head comprising a retainer ring configured to surround the wafer, and the retainer ring comprising an abrasive structure configured to contact the upper surface of the polishing pad. The abrasive structure comprises a lower surface having apexes and valleys covered by a conformal film. The method further comprises moving at least one of the carrier head or the polishing pad relative to the other, and using the abrasive structure of the retainer ring to maintain a roughness of the upper surface of the polishing pad.

In accordance with another embodiment, the present disclosure relates to a method of performing a planarization process. The method comprises placing a wafer between a carrier head and an upper surface of a polishing pad, the carrier head comprising a housing and a retainer ring configured to surround the wafer, and the retainer ring comprising an abrasive structure configured to contact the upper surface of the polishing pad. The method further comprises adjusting a pressure of the abrasive structure on the polishing pad by adjusting a pressure within a cushion member. The cushion member is arranged vertically between the housing and the retainer ring and extends laterally beyond opposing outer sidewalls of the retainer ring. The method further comprises moving at least one of the carrier head or the polishing pad relative to the other, and using the abrasive structure of the retainer ring to maintain a roughness of the upper surface of the polishing pad.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A polishing system, comprising:
   a carrier head configured to enclose a wafer, the carrier head comprising a retainer ring configured to laterally surround the wafer, wherein the retainer ring comprises a lower surface having a plurality of protrusions that form apexes and valleys;
   a cushion member arranged between a lower surface of a housing and a topmost surface of the retainer ring, wherein the cushion member continuously extends along opposing outer sidewalls of the retainer ring and the topmost surface of the retainer ring;
   a membrane support surrounded by the retainer ring and defining one or more ports extending between a top of the membrane support and a bottommost surface of the membrane support, wherein one or more chambers coupled to the one or more ports are defined by the bottommost surface of the membrane support and by interior sidewalls of a flexible membrane having a bottommost surface configured to contact the wafer, the flexible membrane further comprising an outermost sidewall that continuously extends from the bottommost surface of the flexible membrane to a topmost surface of the flexible membrane, the topmost surface of the flexible membrane being vertically below the bottommost surface of the membrane support and physically contacting the bottommost surface of the membrane support directly above one of the one or more chambers;
   a conformal film covering bottoms and sidewalls of the plurality of protrusions; and
   wherein the retainer ring, when viewed in cross-section, has segments disposed on opposing sides of the membrane support, the segments respectively comprising a symmetric structure having opposing outermost sidewalls that are coupled to opposing uppermost sidewalls of the retainer ring by horizontally extending surfaces of the retainer ring, the horizontally extending surfaces being vertically below the opposing uppermost sidewalls and above a top of the one or more chambers.

2. The polishing system of claim 1, wherein the conformal film comprises a sidewall that vertically extends from below a bottom of a protrusion of the plurality of protrusions to a horizontally extending surface of the conformal film that is laterally between the protrusion and an adjacent protrusion, the sidewall extending along a straight line that is parallel to a sidewall of the protrusion.

3. The polishing system of claim 1,
   wherein a bottom surface of the cushion member extends from directly over the horizontally extending surfaces to laterally past at least one of the opposing outermost sidewalls of the retainer ring.

4. The polishing system of claim 1,
wherein the retainer ring comprises sidewalls defining grooves having a substantially constant width, the grooves arranged along the lower surface of the retainer ring and extending radially outward from a point at a center of the retainer ring; and
wherein the grooves extend in a direction that is normal to an interior surface of the retainer ring facing the center of the retainer ring and an exterior surface of the retainer ring facing away from the center.

5. The polishing system of claim 1, wherein the interior sidewalls of the flexible membrane have a maximum height that is less than maximum heights of the one or more chambers below the bottommost surface of the membrane support.

6. The polishing system of claim 1, wherein the plurality of protrusions are triangular shaped protrusions separated from one another by a flat horizontal surface of the retainer ring, the triangular shaped protrusions and the flat horizontal surface forming a trapezoid shaped space separating adjacent ones of the triangular shaped protrusions as viewed along a cross-sectional view.

7. The polishing system of claim 1, wherein the one or more chambers comprise different sized chambers.

8. A polishing system, comprising:
a polishing pad;
a carrier head configured to enclose a wafer, the carrier head comprising:
a membrane support having sidewalls forming one or more ports, wherein one or more chambers are coupled to the one or more ports and are formed by a bottommost surface of the membrane support and a flexible membrane having a lower surface configured to contact the wafer;
a retainer ring configured to surround the wafer and the membrane support, wherein the retainer ring, when viewed in cross-section, has first and second segments disposed on opposing sides of the membrane support, the first and second segments respectively comprising a symmetric structure having opposing outermost sidewalls that are respectively coupled to opposing uppermost sidewalls of the retainer ring by horizontally extending surfaces of the retainer ring, the horizontally extending surfaces being vertically below the opposing uppermost sidewalls and above a top of the one or more chambers; and
an abrasive structure configured to contact an upper surface of the polishing pad; and
wherein the abrasive structure comprises a lower surface having a plurality of protrusions that form apexes and valleys, wherein a conformal film covers bottoms and sidewalls of the plurality of protrusions, the conformal film having an outer surface that continuously extends along a line that is parallel to a sidewall of an overlying one of the plurality of protrusions and that covers the sidewall of the overlying one of the plurality of protrusions.

9. The polishing system of claim 8, wherein the outer surface of the conformal film continuously extends along the line from vertically over the apexes of the plurality of protrusions to vertically below the apexes.

10. The polishing system of claim 8, wherein the carrier head further comprises a housing continuously extending from over the membrane support to a bottommost surface that is laterally outside of the retainer ring, the bottommost surface being vertically between the horizontally extending surfaces and a top of the abrasive structure.

11. The polishing system of claim 8, wherein the conformal film has linearly extending surfaces arranged along opposing sides of the plurality of protrusions, the linearly extending surfaces forming a triangular shaped outer perimeter of the conformal film.

12. The polishing system of claim 8, wherein the conformal film has a substantially uniform thickness between outermost sidewalls of the conformal film.

13. The polishing system of claim 8, further comprising:
a housing arranged over the membrane support and the retainer ring, wherein the housing continuously extends from over the retainer ring to along a side of the retainer ring facing away from the membrane support; and
one or more cushion members arranged vertically between a lower surface of the housing and a top of the retainer ring, wherein the one or more cushion members extend along and cover a part, but not all, of the opposing uppermost sidewalls of the retainer ring.

14. A polishing system, comprising:
a carrier head configured to enclose a wafer, the carrier head comprising:
a retainer ring configured to surround the wafer, wherein the retainer ring, when viewed in cross-section, has segments disposed along opposing sides of the carrier head, the segments respectively comprising a symmetric structure having opposing outermost sidewalls that are coupled to opposing uppermost sidewalls of the retainer ring by horizontally extending surfaces of the retainer ring, the horizontally extending surfaces being vertically between a top and a bottom of the retainer ring and above a top of one or more chambers;
an abrasive structure disposed along a lower surface of the retainer ring and being configured to contact an upper surface of a polishing pad, wherein the abrasive structure includes a plurality of protrusions formed by sidewalls of the retainer ring and separated by one or more horizontally extending surfaces of the retainer ring; and
a conformal film disposed on the plurality of protrusions, wherein the conformal film comprises a flat surface between sidewalls of the conformal film covering sidewalls of adjacent ones of the plurality of protrusions, and wherein the sidewalls of the conformal film comprise a surface that linearly and continuously extends from a bottom of the conformal film to the flat surface.

15. The polishing system of claim 14, wherein the carrier head further comprises:
a membrane support having sidewalls forming one or more ports, wherein the one or more chambers are coupled to the one or more ports and are formed by a bottommost surface of the membrane support and a flexible membrane having a lower surface configured to contact the wafer; and
a housing arranged over the wafer and the retainer ring, wherein the housing continuously extends from over the retainer ring to along one of the opposing outermost sidewalls of the segments of the retainer ring that faces away from the wafer and to vertically below a bottom of the membrane support.

16. The polishing system of claim 14, wherein the plurality of protrusions are aligned along rows extending in a first direction and columns extending in a second direction that is perpendicular to the first direction.

17. The polishing system of claim 14, wherein the plurality of protrusions respectively have a height that is in a range of between 15 μm and 300 μm.

18. The polishing system of claim 14, further comprising:
a membrane support surrounded by the retainer ring and defining one or more ports, wherein the one or more chambers are coupled to the one or more ports and are defined by the membrane support and a flexible membrane having a lower surface configured to contact the wafer; and
a housing coupled to the retainer ring, the housing extending from over the retainer ring, to along outer sides of the retainer ring facing away from the wafer, and to vertically below a bottom of the membrane support.

19. The polishing system of claim 18, further comprising: one or more cushion members arranged between the housing and the retainer ring, wherein the one or more cushion members wrap around the opposing outermost sidewalls of the segments of the retainer ring.

20. The polishing system of claim 14, wherein the retainer ring comprises an additional horizontally extending surface that is laterally disposed between an outermost one of the plurality of protrusions and one of the opposing outermost sidewalls of the segments of the retainer ring.

* * * * *